United States Patent
Lee

(10) Patent No.: US 8,514,001 B1
(45) Date of Patent: Aug. 20, 2013

(54) MEMORY INTERFACE PHASE-SHIFT CIRCUITRY TO SUPPORT MULTIPLE FREQUENCY RANGES

(75) Inventor: Andy L. Lee, San Jose, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 13/462,527

(22) Filed: May 2, 2012

Related U.S. Application Data

(63) Continuation of application No. 11/531,263, filed on Sep. 12, 2006, now Pat. No. 8,188,781, which is a continuation of application No. 10/857,221, filed on May 27, 2004, now Pat. No. 7,126,399.

(51) Int. Cl.
*H03H 11/16* (2006.01)

(52) U.S. Cl.
USPC .......................... 327/233; 327/261

(58) Field of Classification Search
USPC .............. 327/231, 233–238, 241, 243, 244, 327/261
See application file for complete search history.

(56) References Cited

U.S. PATENT DOCUMENTS

| | | | |
|---|---|---|---|
| 5,222,075 A | 6/1993 | Richley | |
| 5,223,756 A | 6/1993 | Bello | |
| 5,223,786 A | 6/1993 | Sakai | |
| 5,555,214 A | 9/1996 | Sung et al. | |
| 5,604,775 A | 2/1997 | Saitoh et al. | |
| 5,633,830 A | 5/1997 | Sung et al. | |
| 5,764,080 A | 6/1998 | Huang et al. | |
| 5,802,540 A | 9/1998 | Sung et al. | |
| 5,828,229 A | 10/1998 | Cliff et al. | |
| 5,970,255 A | 10/1999 | Tran et al. | |
| 5,978,281 A | 11/1999 | Anand et al. | |
| 6,002,282 A | 12/1999 | Alfke | |
| 6,011,744 A | 1/2000 | Sample et al. | |
| 6,044,122 A | 3/2000 | Ellersick et al. | |
| 6,049,255 A | 4/2000 | Hagberg et al. | |
| 6,061,292 A | 5/2000 | Su et al. | |
| 6,100,713 A | 8/2000 | Kalb et al. | |
| 6,128,692 A | 10/2000 | Sung et al. | |
| 6,140,854 A | 10/2000 | Coddington et al. | |
| 6,147,520 A | 11/2000 | Kothandaraman et al. | |
| 6,150,863 A | 11/2000 | Conn et al. | |
| 6,157,690 A | 12/2000 | Yoneda | |
| 6,178,212 B1 | 1/2001 | Akashi | |
| 6,212,113 B1 | 4/2001 | Maeda | |
| 6,212,127 B1 | 4/2001 | Funaba et al. | |
| 6,236,231 B1 | 5/2001 | Nguyen et al. | |
| 6,252,419 B1 | 6/2001 | Sung et al. | |
| 6,269,051 B1 | 7/2001 | Funaba et al. | |
| 6,279,073 B1 | 8/2001 | McCracken et al. | |
| 6,295,245 B1 | 9/2001 | Tomita et al. | |
| 6,316,980 B1 | 11/2001 | Vogt et al. | |
| 6,342,796 B2 | 1/2002 | Jung | |
| 6,346,843 B2 | 2/2002 | Takahashi | |
| 6,351,165 B1 | 2/2002 | Gregorian et al. | |
| 6,351,166 B2 | 2/2002 | Hashimoto | |

(Continued)

*Primary Examiner* — Lincoln Donovan
*Assistant Examiner* — Sibin Chen
(74) *Attorney, Agent, or Firm* — Ropes & Gray LLP

(57) ABSTRACT

The present invention provides a phase shift circuit that supports multiple frequency ranges. The phase shift circuit receives a plurality of control bits and causes a phase shift in a received signal, the phase shift corresponding to a number of time steps, the number depending on the control bits, and the time step is selected from a plurality of different time steps based on a frequency range associated with the received signal.

19 Claims, 15 Drawing Sheets

(56) References Cited

U.S. PATENT DOCUMENTS

| | | |
|---|---|---|
| 6,356,509 B1 | 3/2002 | Abdel-Hafeez et al. |
| 6,392,458 B1 | 5/2002 | Miller, Jr. et al. |
| 6,400,197 B2 | 6/2002 | Lai et al. |
| 6,442,102 B1 | 8/2002 | Borkenhagen et al. |
| 6,445,642 B2 | 9/2002 | Murakami |
| 6,466,491 B2 | 10/2002 | Yanagawa |
| 6,472,904 B2 | 10/2002 | Andrews et al. |
| 6,492,852 B2 | 12/2002 | Fiscus |
| 6,504,790 B1 | 1/2003 | Wolford |
| 6,509,776 B2 | 1/2003 | Kobayashi et al. |
| 6,518,812 B1 | 2/2003 | Sikkink et al. |
| 6,525,565 B2 | 2/2003 | Young et al. |
| 6,525,585 B1 | 2/2003 | Iida et al. |
| 6,570,944 B2 | 5/2003 | Best et al. |
| 6,577,694 B1 | 6/2003 | Meghelli |
| 6,690,201 B1 | 2/2004 | Simkins et al. |
| 6,798,241 B1 | 9/2004 | Bauer et al. |
| 6,806,733 B1 | 10/2004 | Pan et al. |
| 6,816,991 B2 | 11/2004 | Sanghani |
| 6,825,698 B2 | 11/2004 | Wang et al. |
| 6,840,778 B2 | 1/2005 | Engelhardt et al. |
| 6,864,710 B1 | 3/2005 | Lacey et al. |
| 6,864,715 B1 | 3/2005 | Bauer et al. |
| 6,876,186 B1 | 4/2005 | Gupta |
| 6,938,225 B2 | 8/2005 | Kundu |
| 6,940,768 B2 | 9/2005 | Dahlberg et al. |
| 6,946,872 B1 | 9/2005 | Pan et al. |
| 6,967,893 B2 * | 11/2005 | Heyne ............... 365/94 |
| 6,998,897 B2 | 2/2006 | Pilo et al. |
| 7,098,707 B2 | 8/2006 | Starr et al. |
| 7,126,399 B1 | 10/2006 | Lee |
| 7,231,536 B1 | 6/2007 | Chong et al. |
| 7,317,697 B2 | 1/2008 | Lewis et al. |
| 7,375,558 B2 | 5/2008 | Frank et al. |
| 7,463,075 B2 | 12/2008 | White |
| 7,642,830 B2 | 1/2010 | White |

* cited by examiner

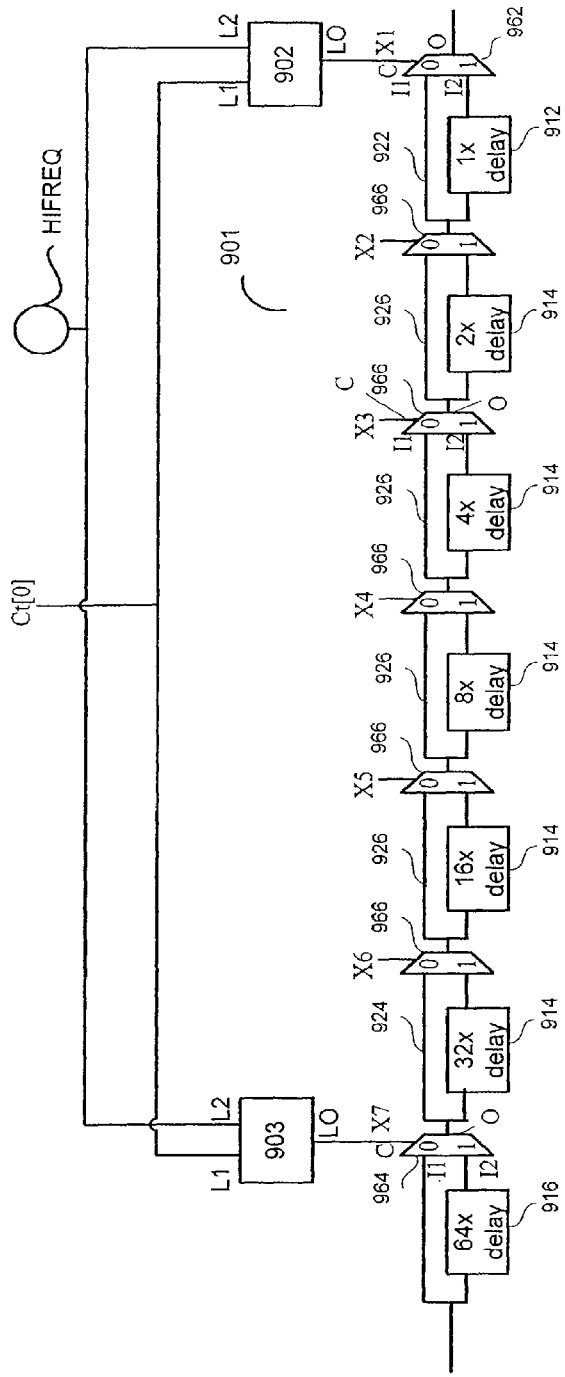

US 8,514,001 B1

MEMORY INTERFACE PHASE-SHIFT CIRCUITRY TO SUPPORT MULTIPLE FREQUENCY RANGES

CROSS REFERENCE TO RELATED APPLICATIONS

This application is a continuation of U.S. patent application Ser. No. 11/531,263, filed Sep. 12, 2006 now U.S. Pat. No. 8,188,781, which is a continuation of U.S. patent application Ser. No. 10/857,221, filed May 27, 2004 (now U.S. Pat. No. 7,126,399), all of which are hereby incorporated by reference herein in their entirety.

BACKGROUND OF THE INVENTION

The present invention relates in general to input/output (I/O) interface architectures in integrated circuits, and in particular to memory interface phase-shift circuitry that supports multiple frequency ranges.

Typical I/O architectures transmit a single data bit on each positive edge of strobe signal and are limited to the speed of the strobe signal. To address the problem of data bandwidth bottleneck between integrated circuits, high speed interface mechanisms have been developed to increase the speed of data transfer and data throughput. In a multiple data rate (MDR) interface scheme, two or more data bits are transferred during each clock period of the strobe signal. For example, in a double data rate (DDR) interface scheme, data can be captured on both a rising edge and a falling edge of the clock to achieve twice the throughput of data. Multiple data rate technologies have thus accelerated the I/O performance of integrated circuits for a wide array of applications from computers to communication systems. For example, the MDR technologies are being employed in today's memory interfaces including interfaces for the double data rate synchronous dynamic random access memory (DDR SDRAM), fast cycle random access memory (FCRAM), reduced latency dynamic random access memory (DRAM I or RLDRAM I or RLDRAM II), and quadruple data rate static random access memory (QDR) as well as other high-speed interface standards.

Programmable logic devices (PLD) have been used to implement memory interface controllers for memory interfaces such as the DDR, QDR, or RLDRAM interfaces. The flexibility of programmable logic in customizing features of the memory interface controller, in addition to the ability to modify the design on-the-fly to meet difficult memory interface timing requirements, are two of the primary advantages of using programmable logic in these applications. To better meet memory timing requirements, dedicated hardware has been added to the PLDs that interface with high-speed memories.

For example, in a basic DDR implementation, a strobe signal (DQS) controls the timing of the transfer of a group of I/O data (also referred to as DQ signals). As mentioned before, for DDR memories, the DQ data are sent on the rising and falling edges of the strobe, as opposed to only once per clock cycle. During a read operation, read data DQ is captured at the PLD side on both rising and falling edges of the read strobe DQS, thus, two bits of data are captured in every cycle. As shown in FIG. 1, the read strobe DQS usually arrives from the memory edge-aligned with the read data DQ. To ensure that valid data is captured by the PLD, the DQS signal needs to be phase-shifted so that the DQS edges are aligned with the centers of data sampling windows associated with the DQ signals. So, PLDs interfacing with DDR memories often include dedicated phase-shifting circuitry to produce the phase-shifted DQS signals.

Typical phase shift techniques that use, for example, delay chains, are highly susceptible to process, voltage, and temperature (PVT) variations. A delay-locked-loop (DLL) circuit can be used to account for these PVT variations and to provide a setting to the delay chain that dictates the number of delay increments to be taken by the delay chain in order to produce the desired amount of phase shift, such as a 90 degree phase shift or a 72 degree phase shift. The number of available settings and the size of the delay increment are associated with the range of memory frequencies supported by the PLD. As the frequency range supported by the PLD becomes larger, such as from a range of 133 MHz to 200 MHz to a range of 100 to 300 MHz, greater demands are placed on the PLD, and in particular on the phase-shift circuitry.

SUMMARY OF THE INVENTION

The present invention provides a phase shift circuit that supports multiple frequency ranges. The phase shift circuit receives a plurality of control bits and causes a phase shift in a received signal, the phase shift corresponding to a number of time steps, the number depending on the control bits, and the time step is selected from a plurality of different time steps based on a frequency range associated with the received signal. The frequency range is one of multiple frequency ranges that include a first frequency range and a second frequency range, the second frequency range covering lower frequencies than the first frequency range. A first time step is used when the frequency range is the first frequency range and a second time step is used when the frequency range is the second frequency range, the second time step being larger than the first time step.

In one embodiment of the present invention, the phase-shift circuit is implemented in a PLD and includes multiple series of delay elements. Each series of delay elements is configured to receive a data strobe signal and to produce a delayed strobe signal having a different amount of phase shift with respect to the strobe signal. The number of delay elements in each series of delay elements is equal to the number of control bits. The phase-shift circuit further includes a first selection device for selecting, based on the frequency range, one of the output signals as the delayed strobe signal. The phase-shift circuit further includes a series of selection devices coupled to each series of delay elements and configured to select according to the control bits one or more delay elements from the series of delay elements to form a delay chain between an input and an output of the series of delay elements.

In an alternative embodiment of the present invention, the phase-shift circuit includes a plurality of delay elements, and a plurality of first selection devices coupled to the delay elements and configured to select according to the control bits one or more of the delay elements to form a delay chain that causes the phase shift in the signal. Each selected delay element includes a plurality of delay cells separated in groups and a second selection device configured to select based on the frequency range one or more groups of delay cells as part of the delay chain.

In yet another embodiment of the present invention, the phase-shift circuit includes a plurality of delay elements, including a first delay element, a second delay element and one or more other delay elements coupled between the first and second delay elements, and devices configured to select, based on the frequency of the signal, either the first delay element or the second delay element to be included in a delay chain that causes the phase shift in the signal. The devices include a first selection device having a first signal input coupled to the first delay element, a second signal input coupled to a signal line bypassing the first delay element, and a first signal output coupled to one of the other delay elements, the first selection device configured to connect either the first or the second signal input to the signal output based on the frequency range and a first one of the control bits. The devices further include a second selection device having a third signal input coupled to the second delay element, a fourth signal input coupled to a signal line bypassing the second delay element, and a second signal output, the second selection device configured to connect either the third or the fourth signal input to the second signal output based on the frequency range and the first one of the control bits.

BRIEF DESCRIPTION OF THE DRAWINGS

FIG. 9C is a schematic of a delay chain in the phase-shift circuit according to an alternative, embodiment of the present invention.

FIGS. 9D and 9E are schematics of two logic circuits in the phase-shift circuit according to one embodiment of the present invention.

DETAILED DESCRIPTION OF THE INVENTION

To support a wide range of memory frequencies, the present invention provides a phase-shift circuit that can be programmed to operate in one of multiple frequency ranges by using a different delay step and a different maximum delay for each of the multiple frequency ranges. For illustrative purposes, the invention is described in the context of a double-data rate (DDR) system. It is to be understood, however, that the principles of this invention can be applied to a variety of data rate systems.

Figure 1:
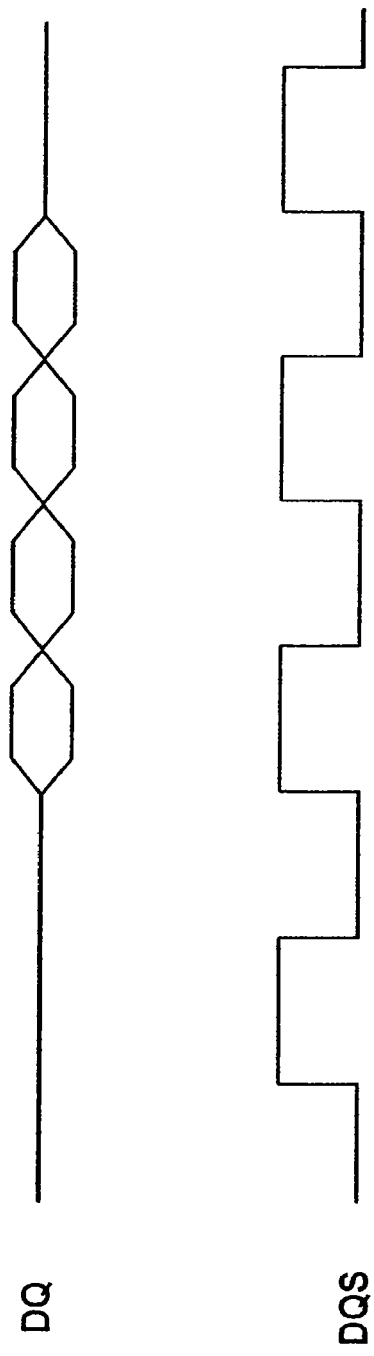
FIG. 1 is a timing diagram illustrating a timing relationship between data signals (DQ) and data strobe signal (DQS) from the DDR memory.
Figure 2B:
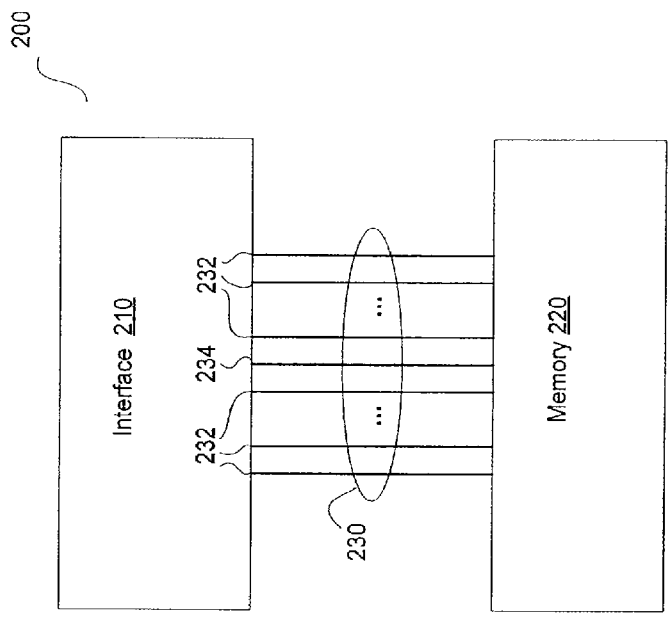
FIG. 2 is a block diagram of a system including a DDR memory and a PLD that interfaces with the memory according to an embodiment of the present invention.
Figure 2A:
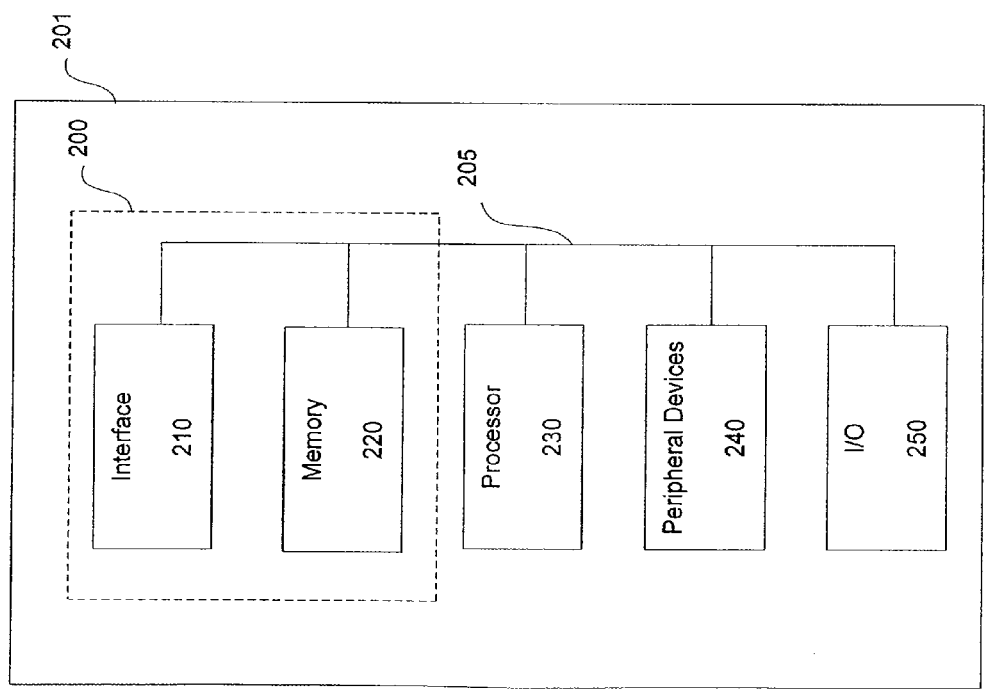

FIG. 2A is a block diagram of an exemplary system 200 including a memory interface circuit (interface) 210, and a multiple-data rate memory device 220, according to one embodiment of the present invention. System 200 may be part of a larger system 201, such as a data processing system, which may include one or more of the following components: a processor 230, peripheral devices 240, and input/output (I/O) device(s) 250, in addition to the components in system 200. The above components in system 201 are coupled together by a system bus 205. System 201 can be used in a wide variety of applications, such as computer networking, data networking, instrumentation, video processing, digital signal processing, or any other application that requires reading and writing data to and from the memory 220.

In this example, memory device 220 may be a double-data rate memory device (e.g., a DDR SDRAM device) that sends or receives a data group of n (e.g., n=8, 16, 32, 64, etc.) DQ data signals with each DQS signal. The number n is often referred to as the data width of the memory device 220. For some memories, there may be one or more parity bits in each data group. These parity bits are not real data, but are used for error-checking. Because of the parity bits, there may be an odd number of DQ data signals in each data group.

As shown in FIG. 2B, system 200 further includes groups of interconnect lines 230 between memory device 220 and interface 210, each group of interconnect lines 230 including n DQ data lines 232 bundled with a DQS strobe line 234 for routing the respective DQ and DQS signals between the memory 220 and the interface 210. Since the DQS signal is routed together with the DQ signals in the same group of interconnect lines 230, the timing skew between DQS and DQ caused by the interconnect lines is minimized.

Figure 4:
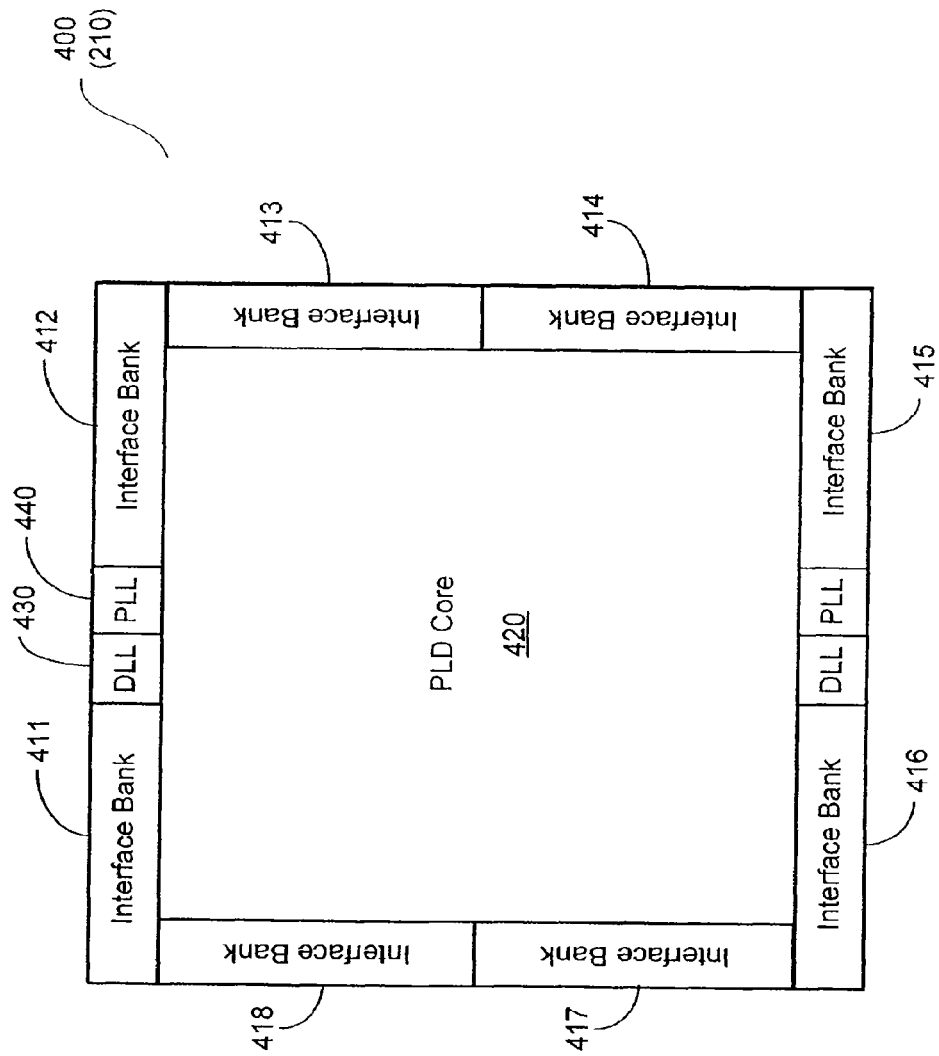
FIG. 4 is a block diagram illustrating a layout architecture for a PLD according to one embodiment of the present invention.

In one embodiment of the present invention, interface 210 is implemented using a PLD that may be configured to perform one of many user-defined functionalities such as a memory controller, microprocessor, digital signal processor, network processor, or the like. FIG. 4 shows a simplified layout architecture for the PLD according to one embodiment of the present invention. As shown in FIG. 4, the PLD includes an integrated circuit die 400, having a plurality of memory interface, banks (banks) 411 through 418 and a PLD core 420. The banks 411-418 are placed in pairs along each edge of the PLD die 400 and connect to PLD core 420. Depending on particular implementations, PLD 400 may also include one or more delay-locked-loop (DLL) circuits 430 and/or one or more phase-locked-loop (PLL) circuits 440 that are shared by various combinations of banks 411 through 418. For example, the pair of banks 411 and 412 along one edge of the die 400 could share a DLL circuit 430 near the same edge of the die 400.

PLD core 420 may be implemented using a variety of different architectures. It is to be understood, however, that the invention is not limited to a particular type of PLD architecture, and that the modular multiple-data-rate I/O architecture of the present invention can be utilized in any type of programmable logic device, many variations of which are described in data books published by Altera Corporation, and in particular those relating to the Armstrong™ PLD family.

Figure 5:
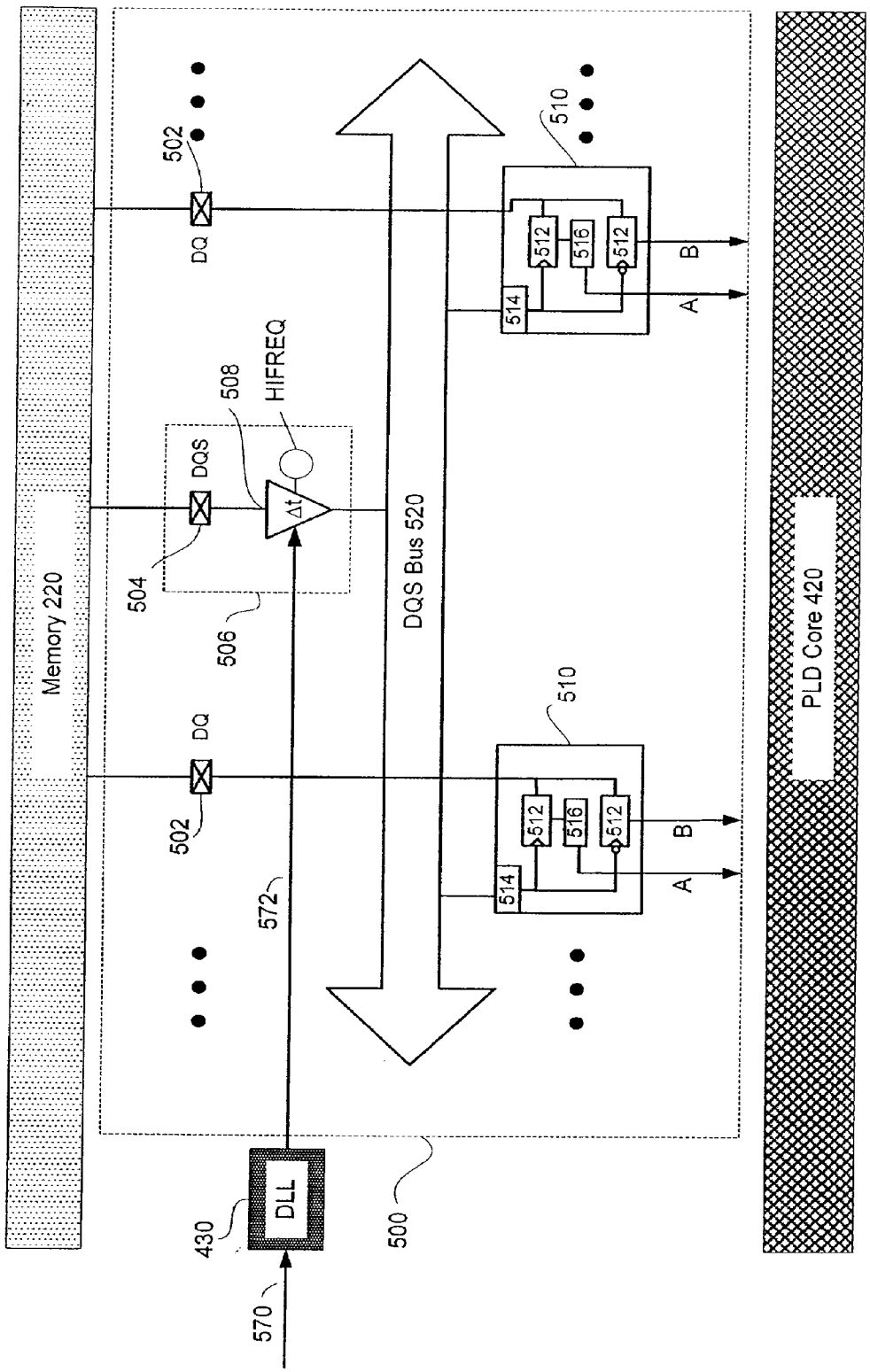
FIG. 5 is a block diagram of an I/O module in the PLD according to one embodiment of the present invention.

FIG. 5 illustrates part of an I/O module 500 in a hank, such as hank 411, of the PLD die 400 according to one embodiment of the present invention. Data arriving at the PLD 400 from the memory 220 is considered Read Data. Data sent to the memory 220 from the PLD 400 is considered Write Data. For ease of illustration, only components for read operations in the I/O module 500 are shown in FIG. 5. As shown in FIG. 5, I/O module 500 includes a plurality of DQ pins 502, and one or more strobe circuits 506, each including a DQS pin 504 and a phase-shift circuit 508 coupled to the DQS pin 504. DQ pins 502 are configured to receive the DQ signals from respective DQ lines 232, and DQS pins 504 are configured to receive the DQS signals from respective DQS lines 234. For most memory standards, the DQ pins 502 are bi-directional, meaning that the DQ pins 502 are configured to receive Read Data from the memory 220 and to transmit Write Data to the memory 220. For some memory standards, the DQ pins 502 are uni-directional, meaning that there are independent DQ pins for Read Data and Write Data.

Like the DQ pins 502, the DQS pins 504 are bi-directional for some memory standards, meaning that they are used to receive read strobe signals from memory 220 during a read operation and to send write strobe signals to memory 220 during a write operation. Some memory standards require uni-directional read strobes and write strobes. In these cases, the DQS pins 504 are used as read strobes, and additional outputs (not shown) are used as write strobes. Also, depending on the memory standards, there are a number n (e.g., n=8, 16, 32, 64, etc.) of DQ pin 502 associated with each DQS pin. Each DQ pin 502 associated with a DQS 504 pin is connected to a different one of the n DQ data lines 232 bundled with a DQS strobe line 234 that is connected to the DQS pin.

Still referring to FIG. 5, I/O module 500 further includes DDR register blocks 510 that are configured to capture the data received by respective ones of the DQ pins 502. Thus, each DDR register block 510 includes at least two input registers 512 that are connected to a DQ pin 502 either directly or through one or more I/O buffers (not shown). Each DDR register block (hereafter referred to as register block) 510 further includes a clock input 514 configured to receive a clock signal that times the capture of the DDR Read Data DQ on opposite edges of the clock signal. During a read operation, the DQ signals received by the DQ pins 502 associated with a DQS pin 504 are transmitted to respective ones of the group of register blocks 510. The DQS signal received by the DQS pin 504 is delayed by going through the phase-shift circuit 508 before arriving at a DQS bus 520. Since typical phase shift techniques in a phase-shift circuit are highly susceptible to process, voltage, and temperature (PVT) variations, a DLL circuit 430 is used to adjust to these variations. The DLL circuit 430 receives a system clock signal via a line 570 and provides a set of control bits, such as control bits Ct[5:0] to the phase-shift circuit 508 via a bus 572, as shown in FIG. 5. The system clock signal can be generated in the PLD 2.10 or elsewhere in the system 201.

The DQS signal is usually not synchronized with the system clock. In one embodiment of the present invention, the DQS signal has the same or approximately the same frequency as the system clock. In other embodiments, one signal may be a harmonic of the other signal. For example, the DQS signal may have a frequency that is twice the frequency of the system clock. Also, the DQS signal is a burst clock that is active by alternating between a first level and a second level when data is received at the DQ pins. At other times, the DQS pins are at a high impedance (i.e., high-z or tristate) condition. The frequency of the DQS signal may vary over a wide range, such as between 100 to 300 MHz. In the DDR implementation, data received by the DQ pins are captured by the register blocks at both rising edges and falling edges of the associated DQS signal.

The phase-shift circuit 508 coupled to each DQS pin 506 in the input/output (I/O) interface module 500 of the PLD 400 receives a plurality of control bits, such as control bits Ct[0:5] from the DLL circuit and causes a phase shift in the DQS signal received by the DQS pin. The phase shift corresponds to the sum of a number of delay increment or time steps, which number is determined by the control bits. The delay increment can be selected from at least two different sizes based on a frequency range associated with the strobe signal. In one embodiment of the present invention, the phase-shift circuit can be programmed to support two frequency ranges, a high frequency range and a low frequency range. The programming is done through a programmable bit HIFREQ shown in FIG. 5. When it is programmed to support the high frequency range, the delay increment is finer and the maximum total delay is smaller. This is because a strobe signal whose frequency is in the high frequency range does not need a large total delay to obtain a desired phase shift, such as a 90 degree phase shift, but may need to use finer delay increments in order to insure the accuracy of the phase shift. On the other hand, when the phase-shift circuit is programmed to support the low frequency range, the delay increment is coarser and the maximum total delay is larger, because a strobe signal whose frequency is in the low frequency range may require a larger total delay to center the edges of the strobe signal in the data sampling window but does not require a fine delay increment.

The DQS bus 520 is configured to route the delayed DQS signal to the clock inputs 514 of the register blocks 510 connected to the DQ pins 502 associated with the DQS pin 504. A conventional DQS bus can be used. Also, one of the DQS bus structures disclosed in copending and co-owned patent application, entitled "Multiple Data Rate Memory interface Architecture," U.S. Ser. No. 10/857,396, which is incorporated herein by reference, may be used. Depending on specific configurations of the I/O module 500, as explained in more detail below, the DQS bus 520 may route multiple DQS signals from multiple DQS pins 504 so that the DQS signal from each of the multiple DQS pins 504 is fed to a group of register blocks 510 that are connected to the DQ pins 502 associated with the DQS pin 504. The delayed DQS signal serves as the dock signal that times the capture of the Read Data in the DQ signals by the register blocks 510. The data are captured at both the rising edges and falling edges of the DQS signal and are sent as data output signals from each register block 510 to the PLD core 420 via lines A and B. To synchronize data output signals on lines A and B, register blocks 510 may further include latches 516 to delay outputting of data from date registers 512 on line. A.

Figure 3:
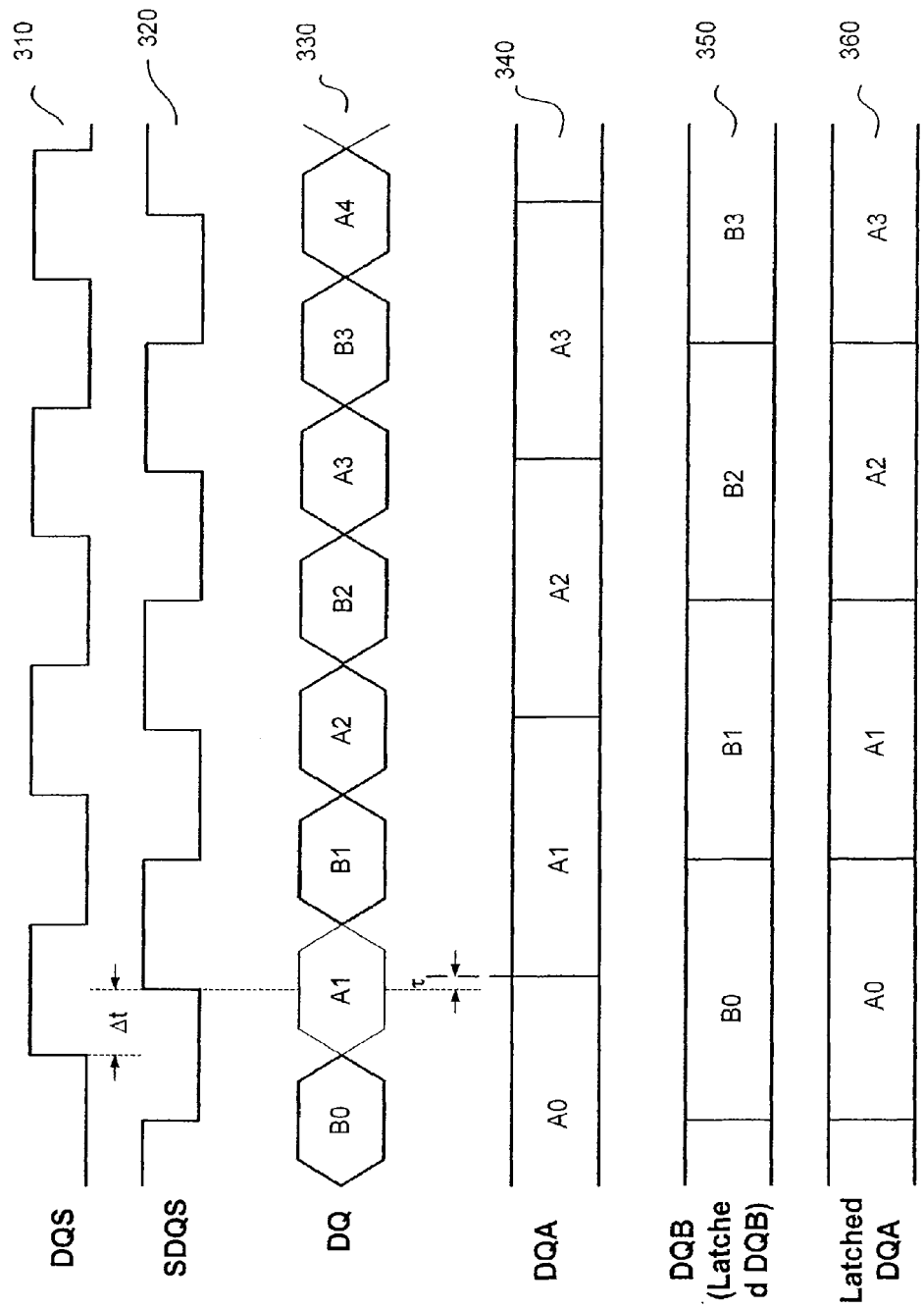
FIG. 3 is a timing diagram illustrating a timing relationship between data signals (DQ) and a delayed data strobe signal (SDQS) in the PLD according to one embodiment of the present invention

FIG. 3 is a timing diagram 300 for the PLD 210 according to one embodiment of the present invention. FIG. 3 depicts input DQS signal 310, delayed DQS signal (SDQS) 320, input DQ signal 330, data output signals DQA 340 and DQB 350, as captured by the data registers 512, and latched data signal DQA 360, which is output via lines A from latch 516 shown in FIG. 5. Input DQS signal 310 alternates between a first level and a second level. DQ signal 330 is made up of data bits such as A1, B1, A2, B2, etc. Coming from the memory 220, the edges of the DQ signal 330 are approximately aligned to the edges of the input DQS signal 310. For optimum sampling of data, the input DQS signal is delayed to produce the SDQS signal 320. The SDQS signal is phase-shifted relative to the DQS signal by a duration Δt, which can be roughly one quarter to one fifth of a DQS clock cycle, to facilitate the capturing of data by the data registers 512. The data registers 512 produce de-interleaved data outputs DQA 340 and DQB 350. DQB 350 is output directly from the register blocks 510 on line B, DQA 340 is latched by latches 516 before being output on lines A. Specifically, DQA 340 includes every other bit, such as A1, A2, etc., and DQB 350 includes the other alternating data bits, such as B1, B2, etc. A change in DQA 340 follows a rising edge of SDQS 320 by a delay τ. A change in DQB 350 follows a falling edge of SDQS 320 by a similar duration.

Figure 6:
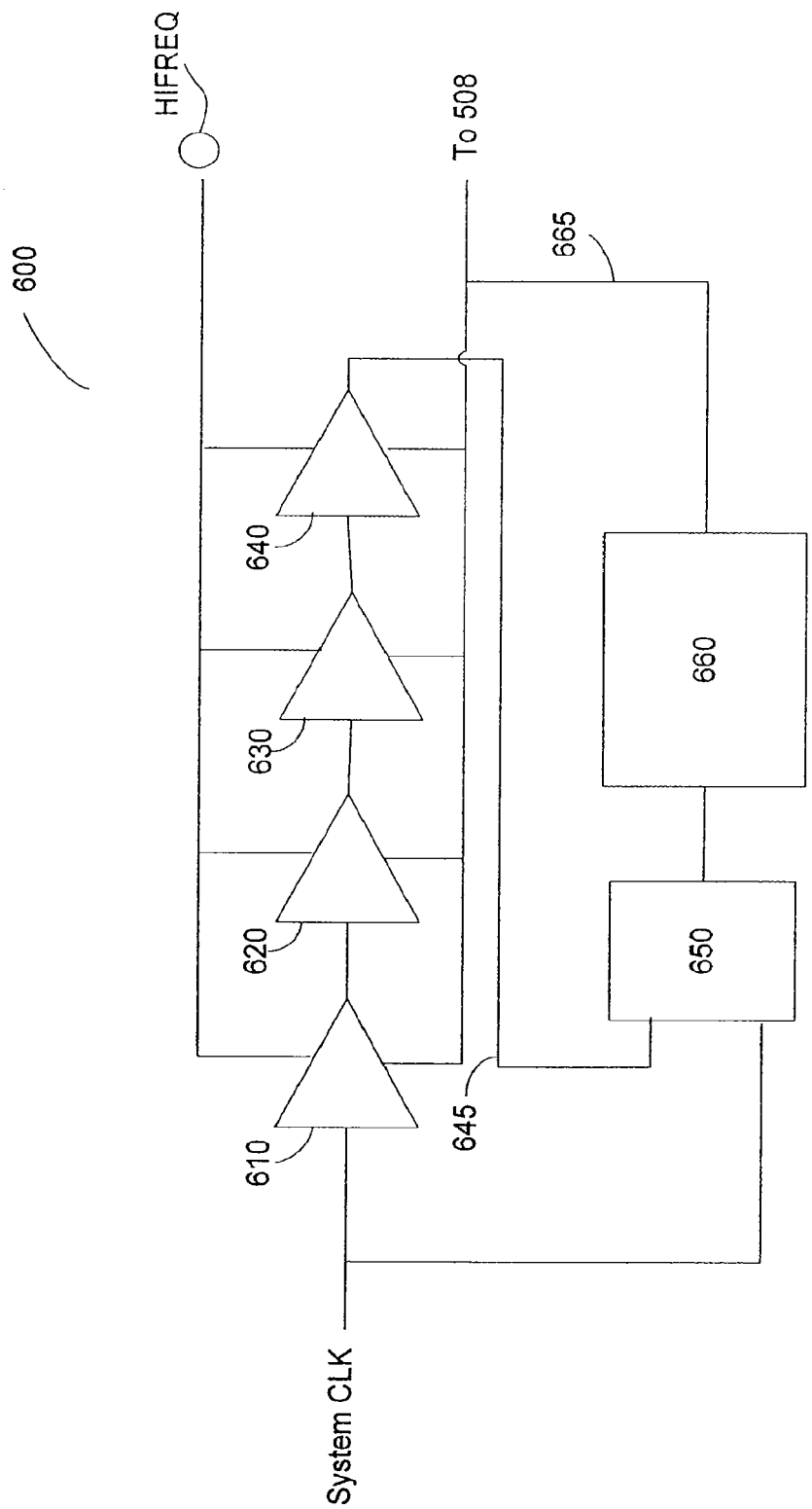
FIG. 6 is a schematic of a DLL circuit according to one embodiment of the present invention.

FIG. 6 illustrates a DLL circuit 600 that can be used as the DLL circuit 430 in FIG. 5 to provide the control bits to the phase-shift circuit 508 according to one embodiment of the present invention. As shown in FIG. 6, DLL circuit 600 includes a number of serially connected phase-shift circuits, such as phase-shift circuits 610, 620, 630, and 640, each being configured identically or similarly as the phase-shift circuit 508. The number of serially connected phase-shift circuits in DLL 600 depends on the amount of phase shift desired for the phase-shift circuit 508. For example, four serially connected phase-shift circuits are used in DLL 600 if a 90 degree or a quarter of a cycle delay in the DQS signal is desired to be produced by the phase-shift circuit 508, and five serially connected phase-shift circuits are used in DLL 600 if a 72 degree or a fifth of a cycle delay in the DQS signal is desired to be produced by the phase-shift circuit 508. So, together, the serially connected phase-shift circuits should produce a whole-cycle of phase-shift if each phase-shift circuit among the serially connected phase-shift circuits produces the desired phase shift for the phase-shift circuit 508.

DLL 600 further includes a phase detector 650 and a up/down counter 660. Like the DQS signal, the system clock signal also alternates between two levels, a high level and a low level. In one embodiment of the present invention, the system clock has the same frequency as the DQS signal. The serially connected phase-shift circuits receive the system clock and produce a delayed clock signal that has a phase delay with respect to the system clock. The delayed clock signal is sent to the phase detector 650 via a line 645. The phase detector 650, which also receives the system clock, compares the phases of the delayed clock signal and of the system clock, and determines the amount of phase delay in the delayed clock signal. The up/down counter 660 provides a set of control bits, such as control bits Ct[0:5], via a bus 665 to each of the serially connected phase-shift circuits 610, 620, 630, and 640 and to the phase-shift circuit 508 (not shown in FIG. 6). In one embodiment of the present invention, because of their identical or similar configuration, each of the serially connected phase-shift circuits 610, 620, 630, and 640 and the phase-shift circuit 508 should cause the same amount of phase shift in a signal when receiving the same set of control bits.

In a specific embodiment, the phase comparison in the phase detector 650 is done by a D-type flip-flop that determines the level of the delayed clock signal received by the phase detector 650 at the rising edges of the system clock. For example, if the level of the delayed clock is low at the rising edges of the system clock, it means that the rising edges of the system clock precede the rising edges of the delayed clock and that the delayed clock has been excessively delayed. Accordingly, the phase detector produces a low signal to the up/down counter 660, which instructs the up/down counter to count down by one the set of control bits Ct[5:0] so as to reduce the delay caused by each of the serially connected phase-shift circuits 610, 620, 630, and 640 by one delay increment. Conversely, if the phase detector 650 determines that the rising edges of the delayed clock is ahead of the system clock, it produces a high signal, which instructs the up/down counter to count up by one the set of control bits Ct[5:0] so as to increase the delay caused by each of the serially connected phase-shift circuits 610, 620, 630, and 640 by one delay increment.

Figure 7A:
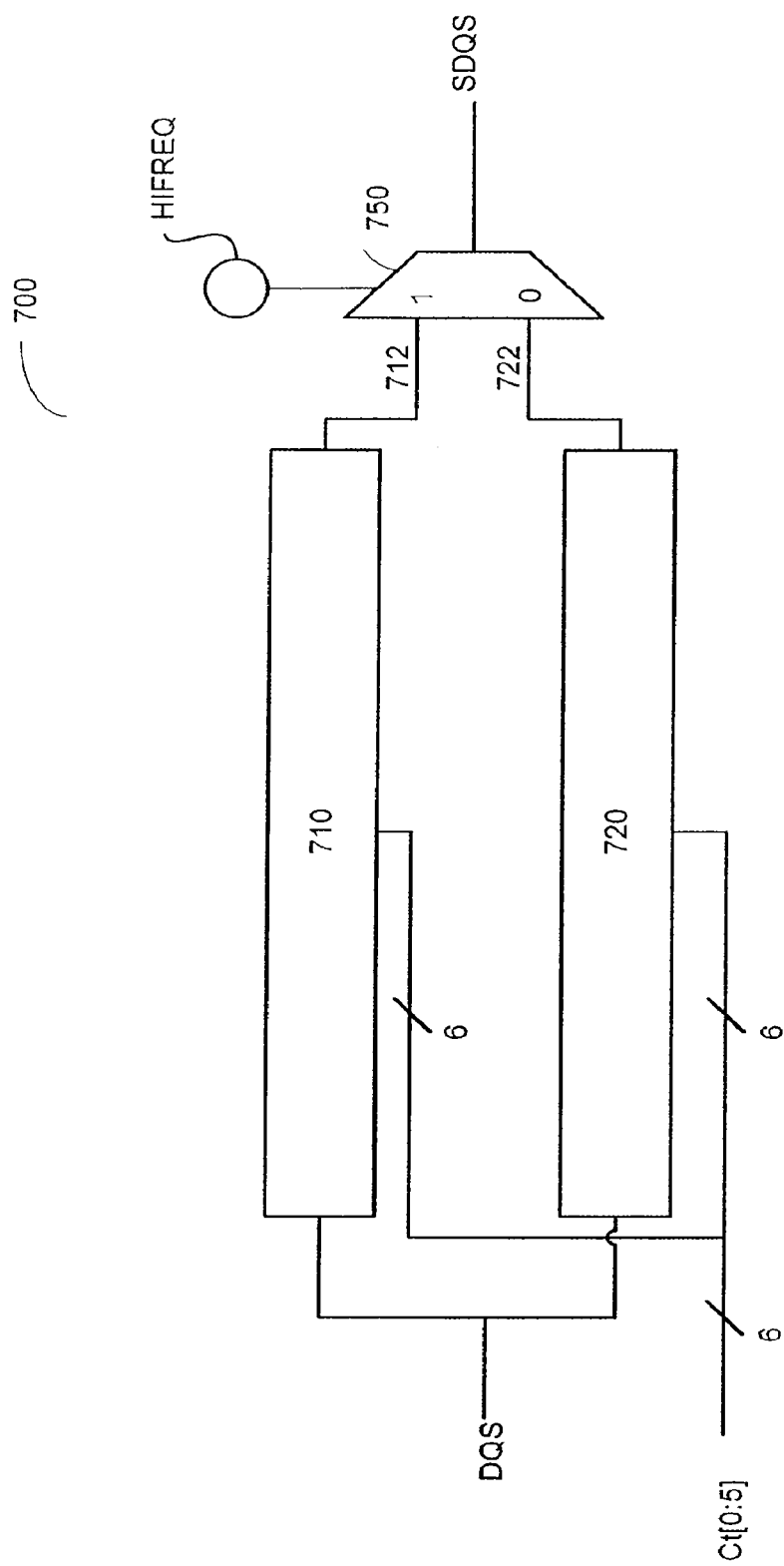
FIG. 7A is a block diagram of a phase-shift circuit according to one embodiment of the present invention.

FIG. 7A illustrates a phase-shift circuit 700 that can be used as the phase-shift circuit 508 according to one embodiment of the present invention. As shown in FIG. 7A, the phase-shift circuit 700 includes multiple delay chains, such as delay chains 710 and 720. Delay chains 710 and 720 receive the DQS signal from the DQS pin and produce output signals on lines 712 and 722, respectively. The output signals on lines 712 and 722 have different phase shifts with respect to the DQS signal. Each of the delay chains 710 and 720 also receives the control bits Ct[0:5], which controls the amount of phase shift produced by the delay chain. In one embodiment of the present invention, the amount of phase shift produced by each delay chain is equal to a number of delay increments associated with that delay chain, which number corresponds to the setting of the control bits. The phase-shift circuit 700 further includes a selection device 750, which can be controlled using the programmable bit HIFREQ to select either the output signal on line 712 or the output signal on line 722 as the delayed strobe signal (SDQS) according to the frequency range associated with the DQS signal. For example, the phase-shift circuit 700 can be programmed to support two frequency ranges, a high frequency range and a low frequency range. When the DQS signal is in the high frequency range, the output signal on line 712 from delay chain 710 is selected, and when the DQS signal is in the low frequency range, the output signal 722 from delay chain 720 is selected.

Figure 7B:
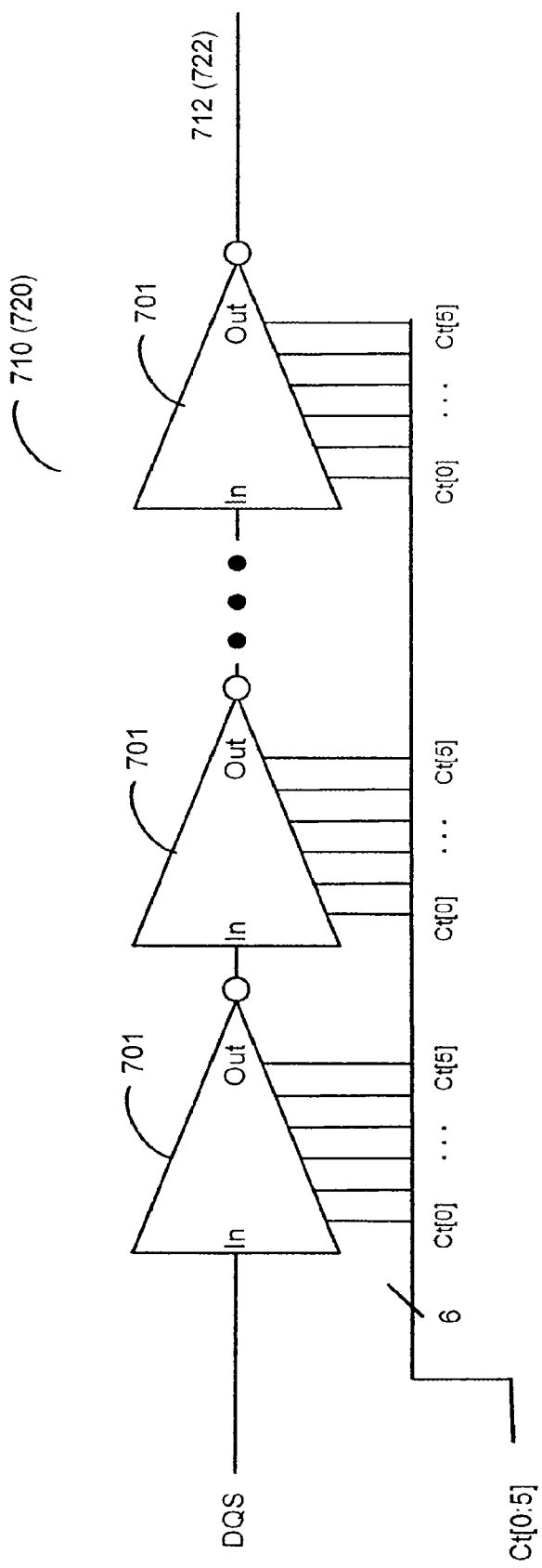
FIG. 7B is a schematic of a delay chain in the phase-shift circuit according to one embodiment of the present invention.

The delay chain 710 or 720 can be one of a variety of conventional delay chains that produces a phase shift in a signal according to a number of control bits. FIG. 7B illustrates one implementation of the delay chain 710 or 720. In one embodiment of the present invention, as shown in FIG. 7B, the delay chain may include a series of current-starved inverters 701, each producing a portion of the phase shift according to the control bits Ct[0:5]. Because delay chain 710 is configured to support a higher frequency range than delay chain 720, the current-starved inverters in delay chain 710 are configured to delay a signal using a finer delay increment than the current-starved inverters in delay chain 720.

Figure 7C:
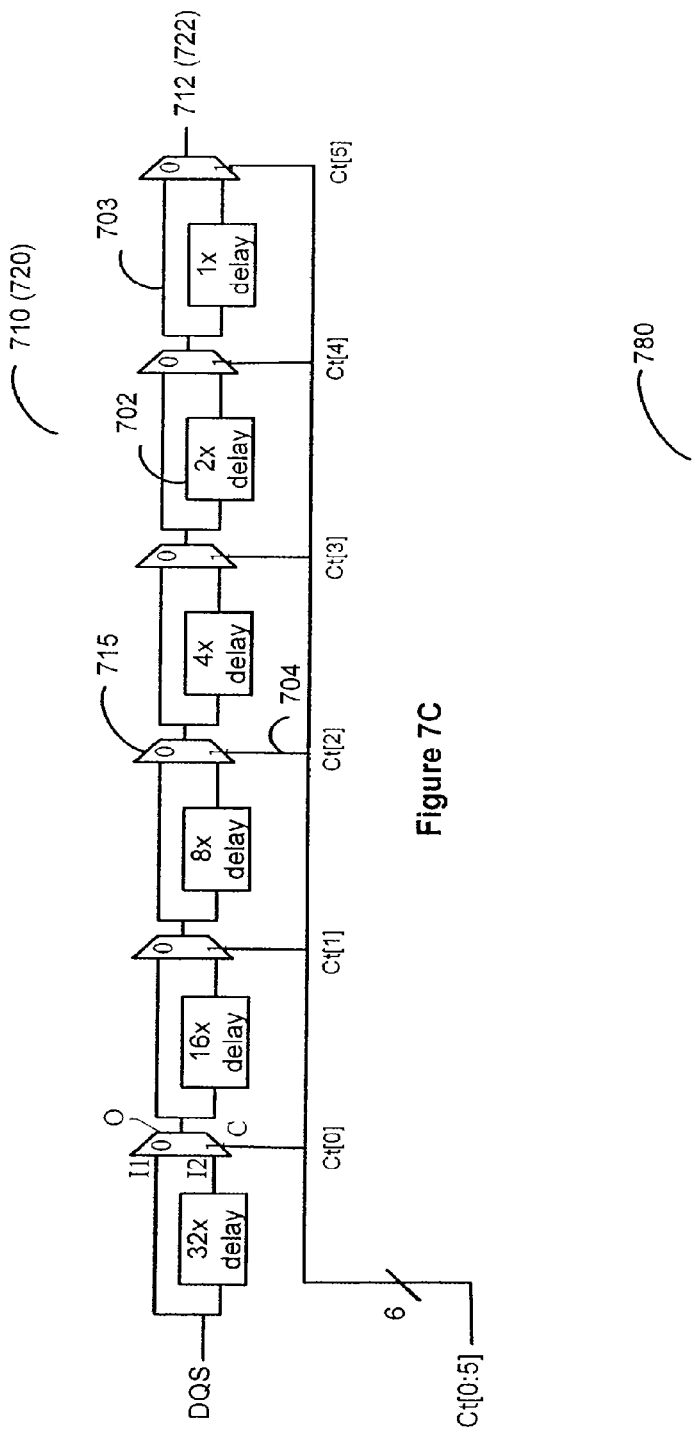
FIG. 7C is a schematic of a delay chain in the phase-shift circuit according to an alternative embodiment of the present invention.

Alternatively, as shown in FIG. 7C, the delay chain 710 or 720 may include a number of delay elements 702, each receiving one of the control bits. Where there are 6 control bits, as in one embodiment of the present invention, each of delay chain 710 and 720 includes 6 delay elements 702. The six delay elements 702 in each delay chain are preferably configured to produce different amounts of delays so that by using the control bits to select a combination of delay elements from the delay chain, the delay chain can be used to produce a desired number of delay increments. For example, the six delay elements 702 in delay chain 710 or 720 may be configured to produce delays equal to one delay increment, two times the delay increment, four times the delay increment, eight times the delay increment, sixteen times the delay increment, and thirty-two times the delay increment, respectively.

As shown in FIG. 7C, delay chain 710 or 720 further includes a plurality of selection devices 715 to facilitate using the control bits to select a combination of delay elements from each delay chain. Each selection device 715 has at least two signal inputs, I1 and I2, a signal output O, and a control input C. Signal input I1 of each selection device is coupled to a respective one of the delay elements 702, and signal input I2 of the selection device is coupled to a line 703 bypassing the delay element. Signal output O of each selection device is coupled to the next delay element in the same delay chain or, if there is no next delay element in the delay chain, it is coupled to line 712 or 722, depending on which delay chain the selection device is in. The control input of each selection device 715 is coupled to a line 704 receiving one of the control bits. Thus, each selection device can be configured by the control bit received through its control input, to choose whether to include the delay element coupled to one of its inputs in the delay chain or to bypass the delay element. Therefore, any number of delay increments between 0 to 63 times the delay increment can be obtained using the 6 control bits. A conventional selection device such as a multiplexer can be used as each of the selection devices 715.

Figure 7D:
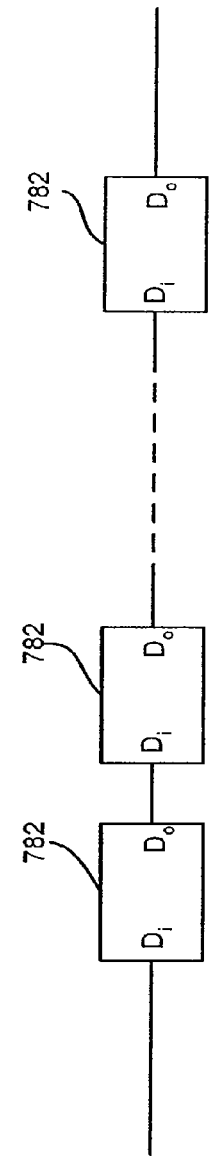
FIG. 7D is a schematic of a delay element in the delay chain according to the alternative embodiment of the present invention.

FIG. 7D illustrates a delay element 780 that can be used as a delay element 701 in the phase-shift circuit 700 according to one embodiment of the present invention. As shown in FIG. 7D, delay element 780 includes one or more serially connected delay cells 782, each having a signal input $D_i$ and a signal output $D_o$, and each is configured to receive an input signal through its signal input $D_i$ and to produce through its output $D_o$ an output signal that is delayed by one delay increment with respect to the input signal. Thus, the number of serially connected delay cells 782 in the delay element 780 determines the number of delay increments or the amount of delay that can be produced in a signal using the delay element 780. For example, a delay element 780 that produces a delay equal to 8 delay increments includes 8 delay cells 782. A conventional delay cell can be used as the delay cell 782, which may include devices such as one or more capacitors for delaying the signal received at the signal input $D_i$ and one or more inverters for squaring up the delayed signals at the signal output $D_o$. In one embodiment of the present invention, the delay cells 782 in each delay chain of delay elements 702 in FIG. 7A are identically or similarly configured so that they produce the same delay increment associated with the delay chain. But the delay increment produced by each delay cell 782 in one delay chain of delay elements, such as delay chain 710, is different from the delay increment produced by each delay cell 782 in another delay chain of delay elements, such as delay chain 720. In one embodiment of the present invention, the delay increment associated with delay chain 710 is half the delay increment associated with delay chain 720.

Figure 8A:
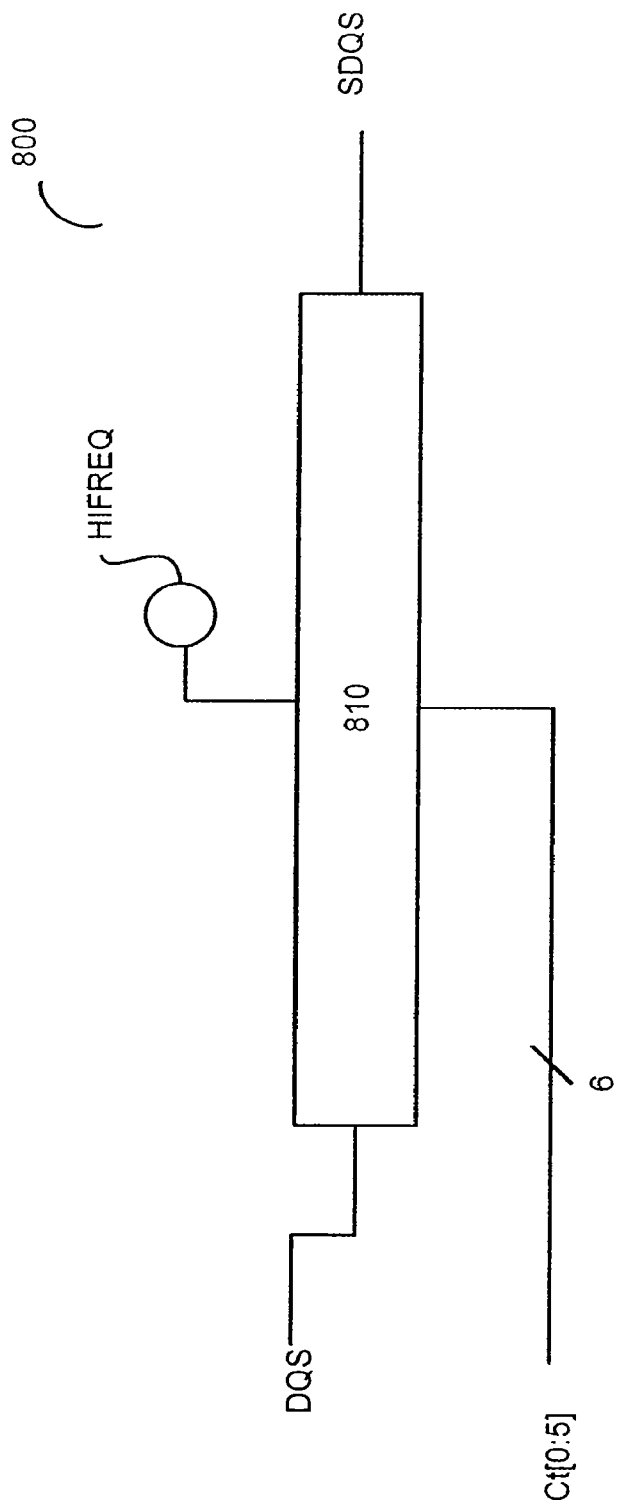
FIG. 8A is a block diagram of a phase-shift circuit according to an alternative embodiment of the present invention.

FIG. 8A illustrates a phase-shift circuit 800 that can be used as the phase-shift circuit 508 according to an alternative embodiment of the present invention. Phase-shift circuit 800 includes a single delay chain 810 that receives the DQS signal as an input and produces the delayed DQS signal (SDQS) as an output. The amount of phase-shift in SDQS with respect to DQS is controlled by the control bits Ct[0:5] and the setting of the HIFREQ bit, which are also received by the delay chain 810.

Figure 8B:
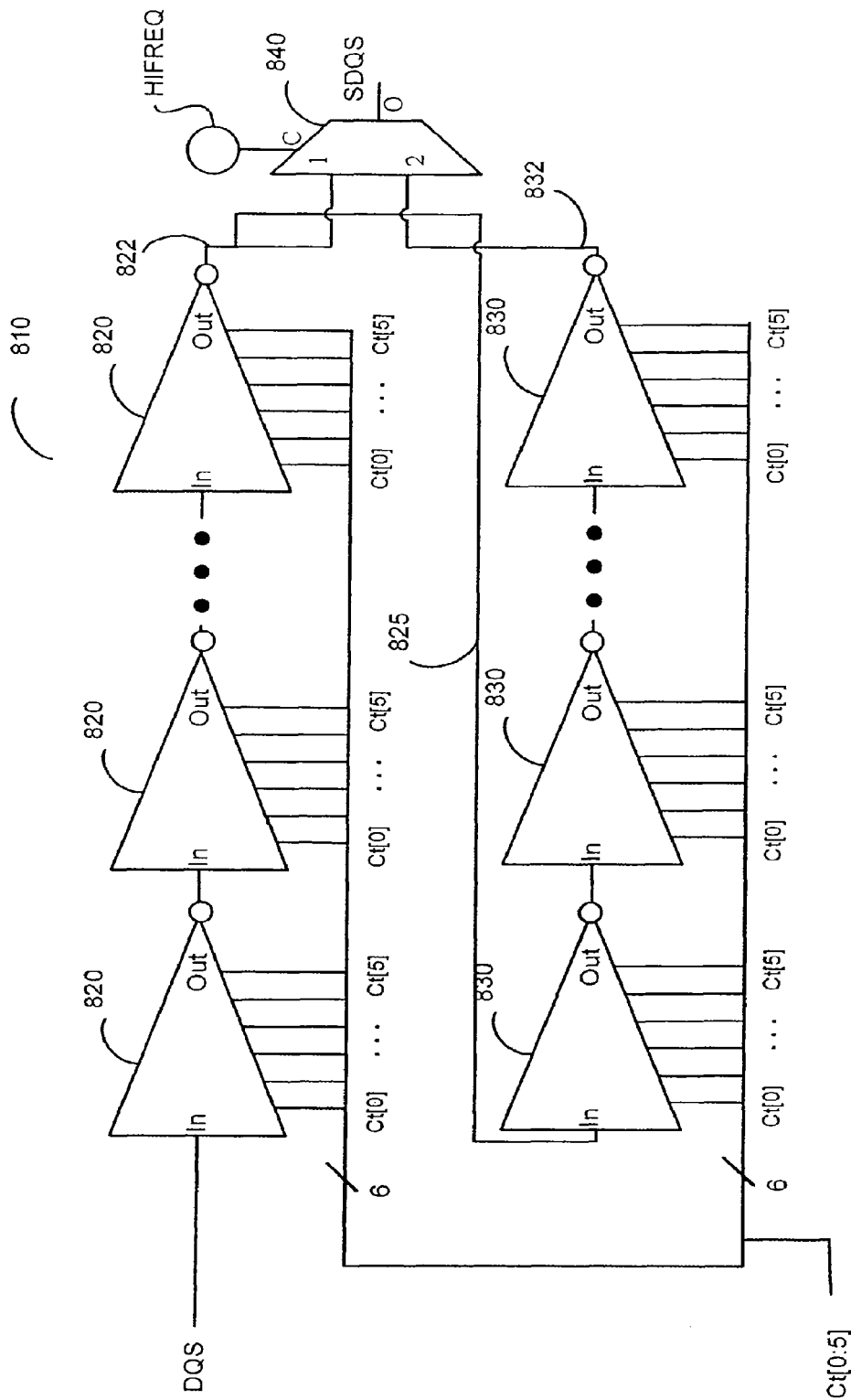
FIG. 8B is a schematic of a delay chain according to one embodiment of the present invention.

In one embodiment of the present invention, as shown in FIG. 8B, the delay chain 810 includes a plurality of current-starved inverters, including a first group of serially connected current-starved inverters 820 and a second group of serially connected current-starved inverters 830. Each of the current-starved inverters 820 or 830 is configured to receive a signal through its input "In" and outputs a signal through its output "Out" that is phase-shifted with respect to the received signal at the input "In." The amount of phase-shift produced by the current-starved inverter 820 or 830 depends on the control bits Ct[0:5], which it also receives. The first group of serially connected current-starved inverters 820 receives the DQS signal and produces on each of lines 822 and 825 an output signal that is delayed from the DQS signal. The second group of serially connected current-starved inverters 830 receives the output from the first group on line 825 and produces an output signal on line 832 that is further delayed from the DQS signal. The delay chain 810 further includes a selection device 840 that is configured to select either the output from the first group or the output from the second group as the SDQS signal based on the setting of the HIFREQ bit, which the selection device receives at its control input C. Thus, depending on the setting of the HIFREQ bit, the phase-shift in the SDQS signal may be produced by the serially connected current-starved inverters 820 in the first group or by the serially connected current starved inverters 820 and 830 in both the first and the second groups.

Figure 8C:
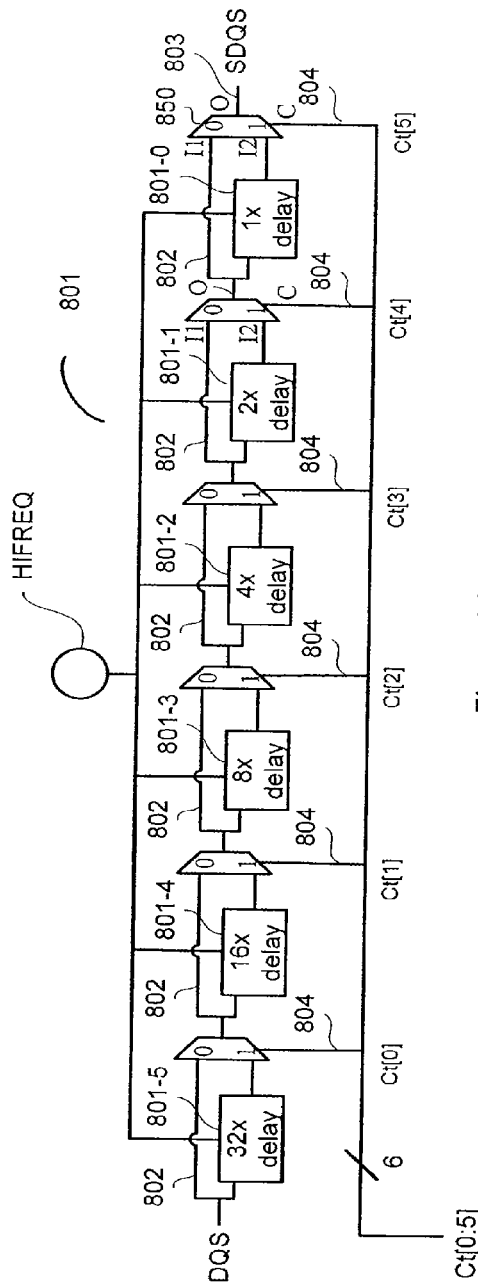
FIG. 8C is a schematic of a delay chain according to an alternative embodiment of the present invention

Alternatively, as shown in FIG. 8C, the delay chain 810 may include a plurality of delay elements, such as delay elements 801-0, 801-1, 801-2, 801-3, 801-4, and 801-5, and a plurality of selection devices 850 coupled to the delay elements and configured to select according to the control bits one or more of the delay elements to contribute to the phase shift in the SDQS signal. For ease of discussion, the delay elements 801-0, 801-1, 801-2, 801-3, 801-4, and 801-5 may separately or collectively be referred to as delay element(s) 801 in the following discussions. Each selection device 850 has at least two signal inputs, I1 and I2, a signal output O, and a control input C. Signal input I1 of each selection device is coupled to a respective one of the delay elements 801, and signal input I2 of the selection device is coupled to a line 802 bypassing the delay element. Signal output O of each selection device is coupled to the next delay element 801 in the delay chain 810, or if there is no next delay element, it is coupled to an output 803 of the delay chain 810. The control input of each selection device 801 is coupled to a line 804 receiving one of the control bits. Thus, the selection device can be configured by the control bit received through its control input, to choose whether to bypass the delay element or to include the delay element coupled to one of its inputs in a series of delay elements contributing the phase shift in SDQS. A conventional selection device such as a multiplexer can be used as each of the selection devices 810.

In one embodiment of the present invention, each of the delay elements 801 can be programmed to produce a different amount of delay according to the setting of the programmable HIFREQ bit. For example, using the programmable HIFREQ bit, phase-shift circuit 800 can be programmed to support two different frequency ranges, a high frequency range and a low frequency range. When the DQS signal is in the high frequency range, the programmable bit is set at 1 and the delay elements 801-0, 801-1, 801-2, 801-3, 801-4, and 801-5 produce delays that are equal to 1 delay increment, 2 delay increments, 4 delay increments, 8 delay increments, 16 delay increments, and 32 delay increments, respectively, as shown in FIG. 8C. When the DQS signal is in the low frequency range, the programmable bit is set at 0 and the delay elements 801-0, 801-1, 801-2, 801-3, 801-4, and 801-5 produce delays that are equal to 2 delay increments, 4 delay increments, 8 delay increments, 16 delay increments, 32 delay increments, and 64 delay increments, respectively. Thus, the delay increments associated with the delay elements 801 in the phase-shift circuit 800 when the DQS is in the low frequency range are twice the delay increments associated with the delay elements 801 when the DQS is in the high frequency range.

Figure 8D:
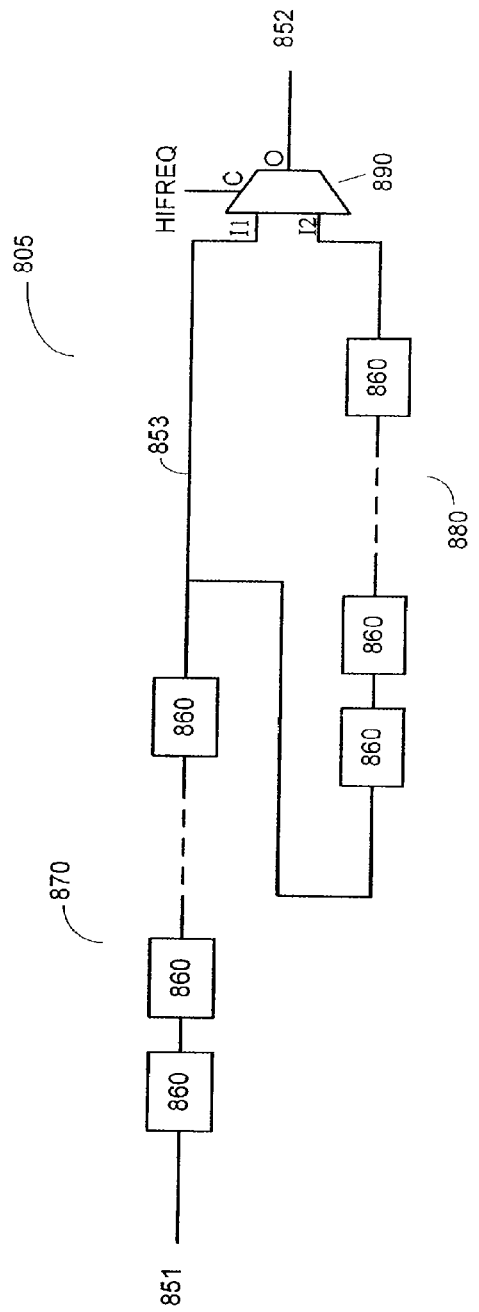
FIG. 8D is a schematic of a delay element according to one embodiment of the present invention.

FIG. 8D illustrates a delay element 805 that can be used as one of the delay elements 801 according to one embodiment of the present invention. As shown in FIG. 8D, delay element 805 includes a signal input 851, signal output 852, and a plurality of serially connected delay cells 860 between the signal input 851 and the signal output 852. The serially connected delay cells 860 are organized in groups, such as groups 870 and 880. Delay element 850 further includes a line 853 bypassing group 880, and a selection device 890 configured to choose, based on the programmable bit HIFREQ, whether to bypass group 880 of the serially connected delay cells. Thus, the selection device 890 has two signal inputs I1 and I2, I1 being connected to the line 853 and I2 being connected to an output of group 880, a control output connected to the programmable bit HIFREQ, and an output O connected to the signal output 852 of the delay element 805. When the programmable hit HIFREQ is set at 1, only group 870 is included in a signal path between the signal input 851 and output 852 of the delay element 805. When the programmable bit HIFREQ is set at 0, both groups 870 and 880 are includes in the signal path between the signal input and output of the delay element 805, and the delay element produces twice the amount of delay as when the programmable bit HIFREQ is set at 1.

Figure 9A:
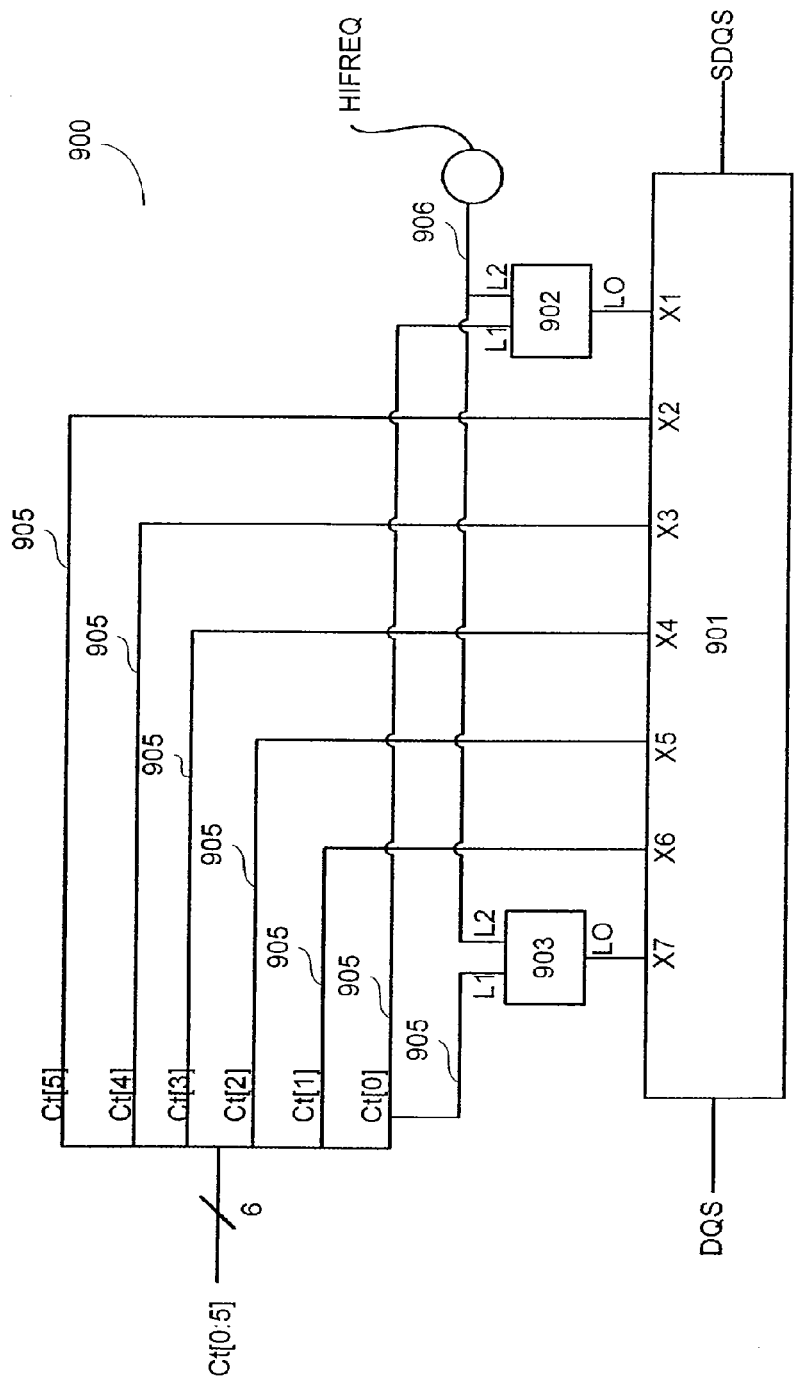
FIG. 9A is a block diagram of a phase-shift circuit according to yet another embodiment of the present invention.

FIG. 9A illustrates a phase-shift circuit 900 that can be used as the phase-shift circuit 508 according to yet another embodiment of the present invention. As shown in FIG. 9A, phase-shift circuit 900 includes a delay chain 901, which receives the DQS signal and outputs the SDQS signal according to a plurality of control bits received at its control inputs, such as control inputs X1 through X7. Phase-shift circuit 900 further includes logic circuits 902 and 903, each having two input terminals L1 and L2 and an output terminal LO. The output terminal LO of the logic circuit 902 is connected to control input X1, and the output terminal LO of the logic circuit 903 is connected to control input X7. Phase-shift circuit 900 further includes lines 905 for receiving the control bits Ct[0:5], respectively, and line 906 for receiving the programmable HIFREQ bit. The lines 905 receiving respective ones of control bits Ct[1:5] are connected to respectively ones of the control inputs X2 through X6. Furthermore, input L1 of each of the logic circuits 902 and 903 is connected to the line 905 receiving the control bit Ct[0], and input L2 of each of the logic circuits 902 and 903 is connected to the line 906 receiving the programmable HIFREQ bit. The logic functions performed by the logic circuits 902 and 903 are respectively listed in Tables I and II below. As shown in Tables I and II, logic circuit 902 is configured to allowed the control bit Ct[0] to control the delay chain 901 through the control input X1 only when the HIFREQ hit is set at a HIGH level (such as 1), and logic circuit 903 is configured to allow the control bit Ct[0] to control the delay chain 901 through the control input X7 only when the HIFREQ bit is set at LOW level (such as 0).

TABLE I

| Logic Function of 902 | | |
|---|---|---|
| L1 (Ct[0]) | L2 (HIFREQ) | LO (X1) |
| 0 | 0 | 0 |
| 1 | 0 | 0 |
| 0 | 1 | 1 |
| 1 | 1 | 0 |

TABLE II

| Logic Function of 903 | | |
|---|---|---|
| L1 (Ct[0]) | L2 (HIFREQ) | LO (X7) |
| 0 | 0 | 1 |
| 1 | 0 | 0 |

TABLE II-continued

| Logic Function of 903 | | |
|---|---|---|
| L1 (Ct[0]) | L2 (HIFREQ) | LO (X7) |
| 0 | 1 | 0 |
| 1 | 1 | 0 |

Figure 9B:
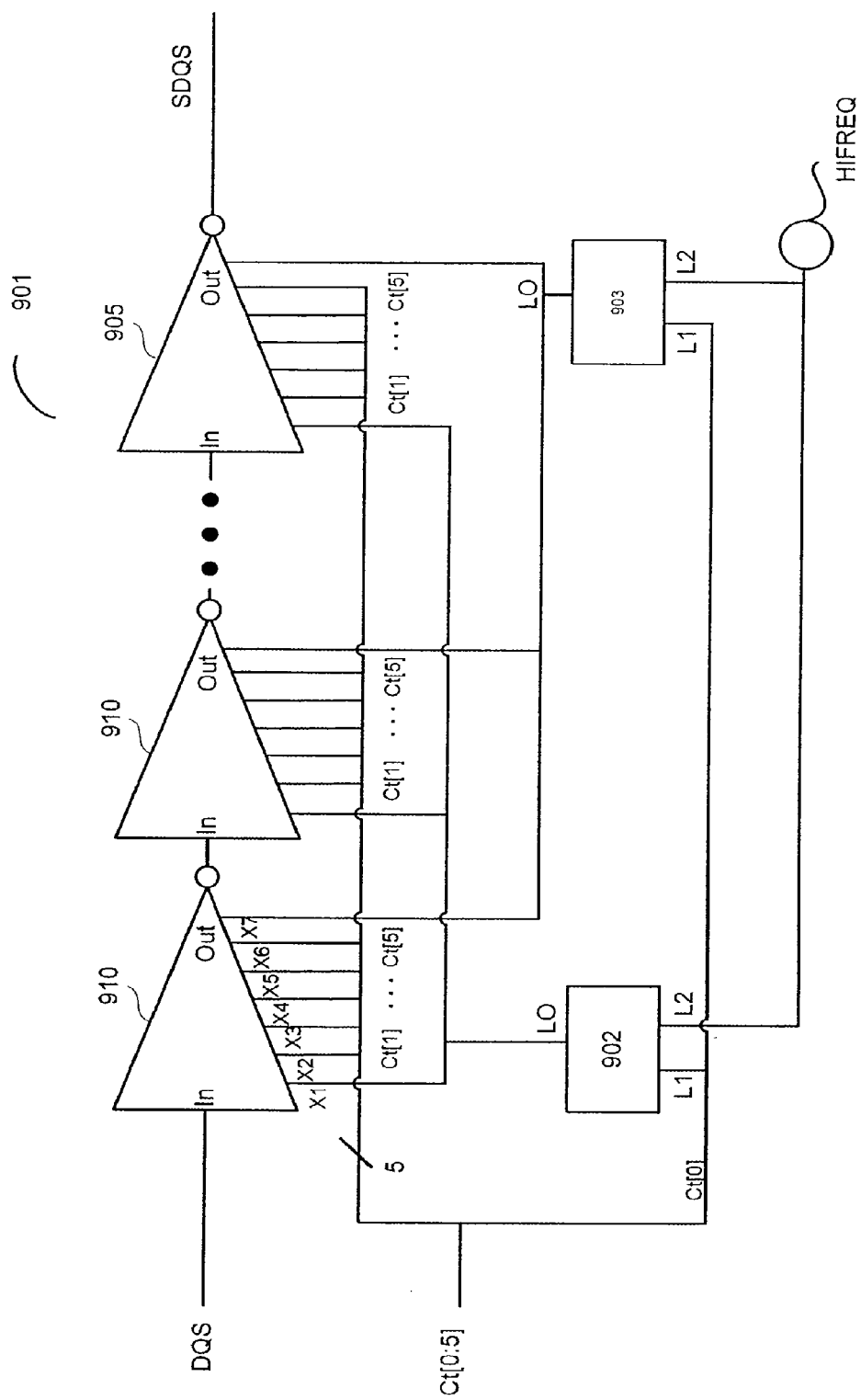
FIG. 9B is a schematic of a delay chain according to one embodiment of the present invention.

The delay chain 901 can be one of a variety of conventional delay chains that produces a phase shift in a signal according to a number of control bits. FIG. 9B illustrates one exemplary implementation of the delay chain 901. As shown in FIG. 9B, delay chain 901 can be implemented using a plurality of serially connected current-starved inverters each having a signal input "In", a signal output "Out", and a plurality of control inputs x1 through x7 that are connected to the control inputs X1 through X7, respectively. When the HIFREQ bit is set at HIGH, each of the current-starved inverters 910 is controlled by the control bits Ct[0:5] through the control inputs x1 through x6, respectively, and the current-starved inverters generate phase-shifts in finer increments. On the other hand, when the HIFREQ bit is set at LOW, each of the current-starved inverters 910 is controlled by the control bits Ct[0:5] through the control inputs x2 through x7, respectively, and the current-starved inverters generate phase-shifts in coarser increments. This way, different delay increments can be used to support different frequency ranges.

Alternatively, as shown in FIG. 9C, the delay chain 901 may include a plurality of delay elements, including a first delay element 912, a second delay element 916, and one or more other delay elements 914 serially connected between the first and second delay elements 912 and 916. The number of delay elements in delay chain 901 is equal to the number of control bits plus one. For example, if the number of control bits is 6, the number of delay elements in delay chain 901 is 7. Also, each of the delay elements 912, 914 and 916 can be used to produce a different amount of delay in the DQS signal received by the phase-shift circuit 900. Furthermore, the amount of delay that can be produced by the first delay element 912 is the minimum among the delays that can be produced by the delay elements in the phase-shift circuit 900, while the amount of delay that can be produced by the second delay element 916 is the maximum among the delays that can be produced by the delay elements in the phase-shift circuit 900. For example, the amount of delay that can be produced by the first delay element 912 may be one delay increment, the amount of delay that can be produced by the second delay element 916 may be 64 delay increments, while the amount of delay that can be produced by the delay elements 914 may be 2 times, 4 times, 8 times, 16 times, and 32 times the delay increment, respectively, as shown in FIG. 9C.

Still referring to FIG. 9C, delay chain 901 further includes a plurality of selection devices 966 configured to include (or exclude) in a series of delay elements contributing to the phase shift in SDQS one or more of the delay elements 916. Each selection device 966 has at least two signal inputs. I1 and I2, a signal output O, and a control input C. Signal input I1 of each selection device 966 is coupled to a respective one of the delay elements 914, and signal input I2 of the selection device 966 is coupled to a line 926 bypassing the delay element 914. Signal output O of each selection device is coupled to the next delay element 914 or to the first delay element 912. The control input of each selection device 966 is connected to a respective one of the control inputs X2 through X6, which receives a respective one of the control bits Ct[1:5]. Thus, the selection device 966 can be configured by a respective one of the control bits Ct[1:5] received through its control input, to choose whether to include the delay element 966 coupled to one of its inputs in the series of delay elements contributing the phase shift in SDQS or to bypass the delay element 914. A conventional selection device such as a multiplexer can be used as each of the selection devices 966.

As shown in FIG. 9C, delay chain 901 further includes a selection device 962, and a selection device 964. Selection device 962 has a first signal input I1 coupled to the first delay element 912, a second signal input I2 coupled to a signal line 922 bypassing the first delay element 912, a signal output O connected to an output of the delay chain 901, and a control input C coupled to the output LO of the logic circuit 902. Selection device 964 has a first signal input I1 coupled to the second delay element 916, a second signal input I2 coupled to a signal line 924 bypassing the second delay element, a signal output O coupled to one of the delay elements 914, and a control input C coupled to the logic circuit 903. Thus, The HIFREQ bit determines whether to allow the control bit Ct[0] to control the first or second selection device. For example, when the HIFREQ bit is set at 0, the output LO of the logic circuit 902 is at 0 irrespective of the control bit Ct[0], and the first delay element 912 is bypassed. On the other hand, when the HIFREQ bit is set at 1, the output LO of the logic circuit 902 depends on the control bit Ct[0] and selection device 962 is configured to choose based on the control bit Ct[0] whether to include the first delay element 912 in the series of delay elements contributing to the phase shift in SDQS. Conversely, when the HIFREQ bit is set at 1, the output LO of the logic circuit 903 is at 0 irrespective of the control bit Ct[0], and the second delay element 916 is bypassed. On the other hand, when the HIFREQ bit is set at 0, the output LO of the logic circuit 903 depends on the control bit Ct[0], and selection device 964 is configured to choose based on the control bit Ct[0] whether to include the second delay element 916 in a series of delay elements contributing the phase shift in SDQS.

Therefore, depending on the programmable bit HIFREQ, the set of control bits Ct[0:5] controls the selection of a combination of delay elements to form the series of delay elements contributing the phase shift in SDQS either from the first delay element 912 and the delay elements 914 or from the second delay element 916 and the delay elements 914. When HIFREQ is set at 1 because DQS is in the high frequency range, the combination of delay elements in the delay chain is selected from the first delay element 912 and the delay elements 914, and the delay chain has a finer delay increment and a smaller maximum delay that is 63 times the delay increments. When HIFREQ is set at 0 because DQS is in the low frequency range, the combination of delay elements in the delay chain is selected from the second delay element 916 and the delay elements 914, and the delay chain has a coarser delay increment and a larger maximum delay. In the example shown in FIG. 9C, the delay increment when HIFREQ is set at 1 is half the delay increment when HIFREQ is set at 0, and the maximum delay when HIFREQ is set at 0 is twice the maximum delay when HIFREQ is set at 1.

FIGS. 9D and 9E illustrate exemplary implementations of the logic circuit 902 and 903, respectively, of FIGS. 9B and 9C according to one embodiment of the present invention. As shown in FIGS. 9D, logic circuit 902 may include an inverter 930 and a NOR gate 940, which are configured to perform together the logic function listed in Table I above. As shown in FIG. 9E, logic circuit 903 may include a NOR gate 950 for performing the logic function listed in Table II above. The present invention is not, however, limited by how the logic blocks and other circuit elements discussed above are implemented.

The present invention has thus been described in detail. It should be understood that various changes, substitutions, and alterations can be made hereto without departing from the spirit and scope of the invention as defined by the appended claims.

I claim:

1. A memory interface comprising:
   an input to receive an input signal;
   a phase-shift circuit coupled to the input to cause a phase shift in the input signal, the phase shift corresponding to a number of time steps, wherein a duration of the time steps depends at least in part on a frequency range associated with the input signal; and
   a phase comparison circuit to control the number of time steps based at least in part on a phase comparison between a reference clock signal and another clock signal, wherein the other clock signal is delayed by the phase shift, or a multiple of the phase shift,
   wherein the frequency range is one of multiple frequency ranges including a first frequency range and a second frequency range that is different from the first frequency range, and wherein the duration of the time steps is a first duration in response to the frequency range corresponding to the first frequency range and the duration of the time steps is a second duration that is different from the first duration in response to the frequency range corresponding to the second frequency range.

2. The memory interface of claim 1 wherein the phase-shift circuit produces a delayed signal having the phase shift with respect to the input signal and the memory interface further comprises:
   multiple delay chains, the delay chains configured to receive the input signal and control bits for controlling the number of time steps, and to produce an output signal having a phase shift with respect to the input signal determined by the control bits, the phase shift in the output signal from one delay chain being different from the phase shift in the output signal from another delay chain; and
   a first selection device for selecting, based on the frequency range, one of the output signals as the delayed signal.

3. The memory interface of claim 2, wherein each delay chain includes a plurality of serially coupled current-starved inverters, each producing a portion of the phase shift in the output signal from the delay chain.

4. The memory interface of claim 2, wherein each delay chain includes a number of delay elements and a number of selection devices, the number being equal to the number of control bits, and the selection devices selecting a combination of delay elements to form a series of delay elements contributing to the phase shift in the output signal from the delay chain.

5. The memory interface of claim 1 wherein the phase-shift circuit comprises:
   a delay chain coupled to a programmable bit, said programmable bit being set according to the frequency range, and the delay chain causing the phase shift according to the programmable bit.

6. The memory interface of claim 5 wherein the delay chain comprises:
   a first group of serially connected current-starved inverters each receiving control bits;
   a second group of serially connected current-starved inverters each receiving the control bits, said first and second groups of serially connected current-starved inverters being serially connected with each other; and a selection device coupled to the first and second groups of serially connected inverters and configured to select either an output from the first group or an output from the second group of serially connected inverters as an output of the delay chain according to the frequency range.

7. The memory interface of claim 5 wherein the delay chain comprises:
 a plurality of delay elements; and
 a plurality of first selection devices coupled to the delay elements and configured to select according to control bits a combination of delay elements from the plurality of delay elements to form a series of delay elements contributing the phase shift in the delayed signal.

8. The memory interface of claim 1 wherein the number of time steps depends at least in part on a set of control bits received by the phase-shift circuit and wherein the phase-shift circuit comprises:
 a delay chain having a first control input and a second control input; and
 logic circuits configured to send one control bit of the control bits to either the first control input or the second control input depending on the frequency range.

9. The memory interface of claim 8 wherein the delay chain includes a plurality of current-starved inverters each having a plurality of control inputs, a first one of the plurality of control inputs is connected to said first control input of the delay chain and a second one of the plurality of control inputs is connected to said second control input of the delay chain.

10. The memory interface of claim 8 wherein said logic circuits include:
 a first logic circuit having a first input receiving the control bit, a second input receiving a programmable bit having a setting depending on the frequency range, and an output coupled to the first control input of the delay chain; and
 a second logic circuit having a first input receiving the control bit, a second input receiving the programmable bit, and an output coupled to the second control input of the delay chain.

11. The memory interface of claim 1 wherein the second frequency range covers lower frequencies than the first frequency range and the second duration is longer than the first duration.

12. An integrated circuit comprising:
 an input to receive an input signal;
 a first adjustable delay line coupled to the input, the first adjustable delay line providing a phase shift corresponding to a number of time steps; and
 a control circuit having an output coupled to the first adjustable delay line, the control circuit controlling the number of time steps, wherein a duration of the time steps depends at least in part on a frequency range associated with the input signal, the output of the control circuit being generated at least in part from a phase comparison between a reference clock signal and an output of a second adjustable delay line,
 wherein the frequency range is one of multiple frequency ranges including a first frequency range and a second frequency range that is different from the first frequency range, where the duration of the time steps is a first duration in response to the frequency range corresponding to the first frequency range and the duration of the time steps is a second duration in response to the frequency range corresponding to the second frequency range.

13. The integrated circuit of claim 12 wherein the first adjustable delay line comprises a series of current starved inverters, where currents in the current starved inverters are controlled by the output of the control circuit.

14. The integrated circuit of claim 12 wherein the first adjustable delay line comprises a series of delay elements, each having an input and an output coupled to one of a first plurality of select circuits, where the first plurality of select circuits are controlled by the output of the control circuit.

15. The integrated circuit of claim 12 wherein the frequency range is controlled by a first control signal and the first adjustable delay line comprises a first set of delay elements, a second set of delay elements, and a select circuit, wherein when the first control signal has a first polarity, an output of the first set of delay elements is selected by the select circuit, and when the first control signal has a second polarity, an output of the second set of delay elements is selected by the select circuit.

16. A method of configuring an integrated circuit, the method comprising:
 configuring a first adjustable delay line coupled to an input of the integrated circuit for providing a phase shift in an input signal received by the input, wherein the phase shift corresponds to a number of time steps; and
 configuring a control circuit having an output coupled to the first adjustable delay line for controlling the number of time steps, wherein a duration of the time steps depends at least in part on a frequency range associated with the input signal, wherein the first adjustable delay line comprises a series of current starved inverters, where currents in the current starved inverters are controlled by the output of the control circuit.

17. The method of claim 16, wherein the frequency range is one of multiple frequency ranges including a first frequency range and a second frequency range that is different from the first frequency range, the method further comprising:
 setting the duration of the time steps to a first duration in response to the frequency range corresponding to the first frequency range and setting the duration of the time steps to a second duration in response to the frequency range corresponding to the second frequency range.

18. The method of claim 17 comprising controlling the first adjustable delay line by a control signal, wherein the controlling comprises:
 in response to the control signal having a first polarity, adjusting the first adjustable delay line over the first frequency range; and
 in response to the first control signal having a second polarity, adjusting the first adjustable delay line over a second range, wherein the second frequency range covers lower frequencies than the first frequency range.

19. The method of claim 16, wherein the output of the control circuit is generated at least in part from a phase comparison between a reference clock signal and an output of a second adjustable delay line.

* * * * *